United States Patent
Hashimoto

(10) Patent No.: US 10,038,308 B2
(45) Date of Patent: Jul. 31, 2018

(54) QUANTUM CASCADE SEMICONDUCTOR LASER

(71) Applicant: SUMITOMO ELECTRIC INDUSTRIES, LTD., Osaka (JP)

(72) Inventor: Jun-ichi Hashimoto, Yokohama (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 15/834,706

(22) Filed: Dec. 7, 2017

(65) Prior Publication Data
US 2018/0166859 A1 Jun. 14, 2018

(30) Foreign Application Priority Data
Dec. 8, 2016 (JP) ................... 2016-238723

(51) Int. Cl.
| H01S 5/34 | (2006.01) |
| H01S 5/22 | (2006.01) |
| H01S 5/343 | (2006.01) |
| H01S 5/042 | (2006.01) |
| B82Y 20/00 | (2011.01) |
| H01S 5/227 | (2006.01) |
| H01S 5/028 | (2006.01) |
| H01S 5/12 | (2006.01) |

(52) U.S. Cl.
CPC .......... *H01S 5/3402* (2013.01); *B82Y 20/00* (2013.01); *H01S 5/0281* (2013.01); *H01S 5/0287* (2013.01); *H01S 5/0425* (2013.01); *H01S 5/12* (2013.01); *H01S 5/227* (2013.01); *H01S 5/2224* (2013.01); *H01S 5/3401* (2013.01); *H01S 5/34313* (2013.01)

(58) Field of Classification Search
CPC .... H01S 5/3401; H01S 5/3402; H01S 5/0281; H01S 5/0287; H01S 5/12; H01S 5/0425; H01S 5/2224; H01S 5/227; H01S 5/34313; B82Y 20/00
See application file for complete search history.

(56) References Cited

U.S. PATENT DOCUMENTS

| 2010/0046568 A1* | 2/2010 | Maulini ................. B82Y 20/00 372/49.01 |
| 2013/0322480 A1* | 12/2013 | Edamura ............... H01S 5/3401 372/45.01 |
| 2017/0170634 A1* | 6/2017 | Tsuji ..................... H01S 5/3402 |

OTHER PUBLICATIONS

Aellen, Thierry, et al., Continuous-wave distributed-feedback quantum-cascade lasers on a Peltier cooler, *Applied Physics Letters*, Sep. 8, 2003, vol. 83 No. 10, p. 1929-p. 1931.

* cited by examiner

*Primary Examiner* — Armando Rodriguez
(74) *Attorney, Agent, or Firm* — Smith, Gambrell & Russell, LLP.

(57) ABSTRACT

A quantum cascade semiconductor laser includes: a semiconductor mesa having a core layer extending in a direction of a first axis, and an end face extending in a direction of a second axis intersecting the direction of the first axis, and the semiconductor mesa being disposed on a principal surface of a substrate; and a reflective layer disposed on the end face of the semiconductor mesa, the reflective layer including a first semiconductor film in contact with the core layer, the core layer having a superlattice structure, the superlattice structure including a quantum well layer and a barrier layer, and the first semiconductor film of the reflective layer having a bandgap equal to or smaller than that of the quantum well layer.

13 Claims, 9 Drawing Sheets

QUANTUM CASCADE SEMICONDUCTOR LASER

BACKGROUND OF THE INVENTION

Field of the Invention

The present invention relates to a quantum cascade semiconductor laser. This application claims the benefit of priority from Japanese Patent application No. 2016-238723 filed on Dec. 8, 2016, which is herein incorporated by reference in its entirety.

Related Background Art

Non-Patent Document, Applied Physics Letters, vol. 83, pp. 1929-1931, 2003, discloses a mid-infrared quantum cascade semiconductor laser including a III-V compound semiconductor.

SUMMARY OF THE INVENTION

A quantum cascade semiconductor laser according to one aspect of the present invention includes: a substrate having a principal surface; a semiconductor mesa disposed on the principal surface of the substrate, the semiconductor mesa having a core layer extending in a direction of a first axis, and an end face extending in a direction of a second axis intersecting the direction of the first axis; and a reflective layer disposed on the end face of the semiconductor mesa, the reflective layer including a first semiconductor film in contact with the core layer. The core layer has a superlattice structure that includes a quantum well layer and a barrier layer. In addition, the first semiconductor film of the reflective layer has a bandgap equal to or smaller than that of the quantum well layer.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

DESCRIPTION OF THE EMBODIMENTS

Figure 1:
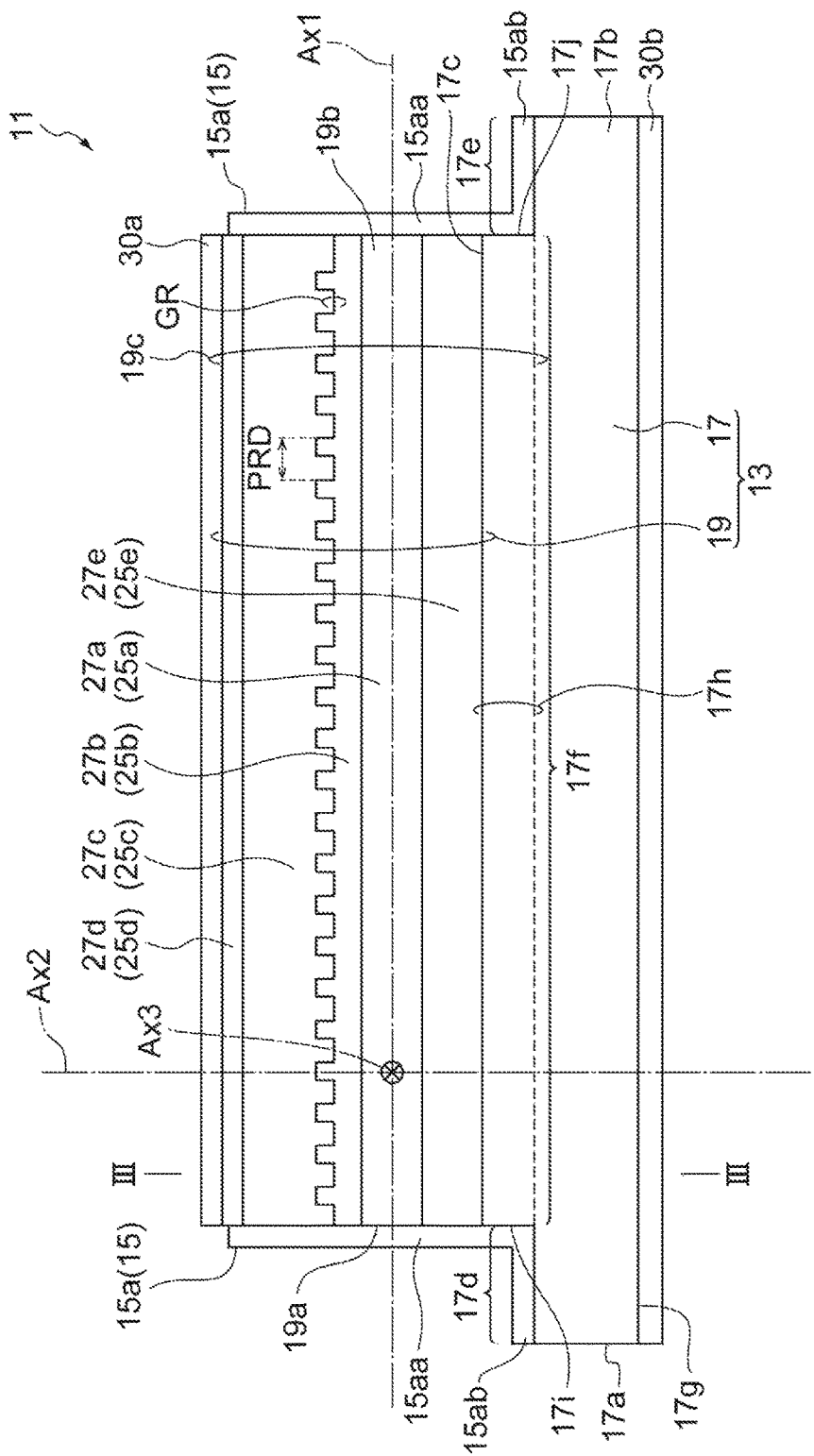
FIG. 1 is a schematic view showing a quantum cascade semiconductor laser according to the present embodiment.

Semiconductor lasers for optical communications have a coating for an optical cavity, which is provided on an end face of a semiconductor mesa enabling laser light to propagate. The coating has, for example, a reflection film of dielectric material, and the dielectric material exhibits substantially no optical absorption of the laser light. Inventor's findings reveal as follows: the coating may include a semiconductor film. The irradiation of a semiconductor with light of a wavelength shorter than the bandgap wavelength of the semiconductor causes the semiconductor to absorb the irradiated light because of optical bandgap-edge transition therein. In view of such interband absorption, the semiconductor film is made of semiconductor material satisfying the following bandgap requirement: the material of the semiconductor should have a shorter bandgap wavelength than the wavelength of light from the core layer (active layer), which acts like a light emitting source. The above requirement on the bandgap wavelength can prevent the interband transition in the semiconductor film on the end face from causing the absorption of the light from the core layer.

Inventor's studies reveal that the semiconductor film on the facet of the core layer constituted by semiconductors, bandgaps of which are smaller than the bandgap thereof, has a little dependence of refractive index on the thickness thereof. Specifically, in the semiconductor film on the facet of the core layer made of semiconductors the bandgaps of which are smaller than the bandgap thereof, the refractive index of the semiconductor film is lower than that of the core layer, and the structure that includes the semiconductor film of the lower refractive index and the core layer with the end face covered thereby has a reflectance which is not more than that of a cleavage end of the core layer.

Some specific embodiments according to the present above aspects are described below.

A quantum cascade semiconductor laser according to an embodiment includes: (a) a substrate having a principal surface; (b) a semiconductor mesa disposed on the principal surface of the substrate, the semiconductor mesa having a core layer extending in a direction of a first axis, and an end face extending in a direction of a second axis intersecting the direction of the first axis; and (c) a reflective layer disposed on the end face of the semiconductor mesa, the reflective layer including a first semiconductor film in contact with the core layer. The core layer has a superlattice structure that includes a quantum well layer and a barrier layer. In addition, the first semiconductor film of the reflective layer has a bandgap equal to or smaller than that of the quantum well layer.

The quantum cascade semiconductor laser includes a combination of the core layer with the first semiconductor film, which has a bandgap not more than that of a quantum well layer in the core layer, on the end face thereof, and the combination bring the end facet reflectance a heavy dependence on the film thickness of the first semiconductor film.

In the quantum cascade semiconductor laser according to an embodiment, the first semiconductor film is made of substantially the same material as that of the quantum well layer in constituent elements and composition of the quantum well layer.

The quantum cascade semiconductor laser allows the material of the first semiconductor film to be substantially the same as that of the quantum well layer, thereby reducing the occurrence of defects at the interface between the first semiconductor film and the quantum well layer. The first semiconductor film and the quantum well layer grown with the same growth condition have substantially the same material in terms of constituent element and composition.

In the quantum cascade semiconductor laser according to an embodiment, the first semiconductor film includes at least one of undoped or semi-insulating semiconductor.

In the quantum cascade semiconductor laser, the material of the first semiconductor film encompasses undoped and semi-insulating semiconductors, which can reduce optical absorption in the first semiconductor film and leakage current flowing via the first semiconductor film.

In the quantum cascade semiconductor laser according to an embodiment, the first semiconductor film includes at least one of GaInAs or GaInAsP.

In the quantum cascade semiconductor laser, the material of the first semiconductor film encompasses GaInAs and GaInAsP, which contain no aluminum as a constituent element thereof and can avoid the occurrence of aluminum oxidation leading to deterioration thereof.

In the quantum cascade semiconductor laser according to an embodiment, the reflective layer includes a second semiconductor film of material having a higher thermal conductivity than that of the first semiconductor film; and the first semiconductor film is disposed between the second semiconductor film and the end face of the semiconductor mesa.

In the quantum cascade semiconductor laser, the second semiconductor film can dissipate heat transmitted from the end face of the semiconductor mesa via the first semiconductor film In the quantum cascade semiconductor laser according to an embodiment, the second semiconductor film of the reflective layer includes at least one of undoped semiconductor or semi-insulating semiconductor.

In the quantum cascade semiconductor laser, the material of the second semiconductor film encompassed undoped and semi-insulating semiconductors, which can reduce optical absorption in the second semiconductor film and leakage current flowing via the second semiconductor film.

In the quantum cascade semiconductor laser according to an embodiment, the second semiconductor film of the reflective layer includes InP, and the second semiconductor film is in contact with the first semiconductor film to form a junction.

The quantum cascade semiconductor laser allows the second semiconductor film to include InP in direct contact with the first semiconductor film, and this direct contact makes it possible to dissipate heat from the end face of the core layer.

The quantum cascade semiconductor laser according to an embodiment may further include an embedding region embedding a side face of the semiconductor mesa. The embedding region includes a first current blocking layer. The semiconductor mesa and the embedding region constitute a waveguide mesa. The first current blocking layer is made of substantially the same material as that of the first semiconductor film in constituent elements and composition of the first semiconductor film.

The quantum cascade semiconductor laser allows semiconductor to cover the side face of the semiconductor mesa in addition to the end face thereof.

In the quantum cascade semiconductor laser according to an embodiment, the first current blocking layer and the first semiconductor film constitute a single semiconductor layer.

The quantum cascade semiconductor laser may include the first current blocking layer and the first semiconductor film which are formed together.

In the quantum cascade semiconductor laser according to an embodiment, the embedding region further includes a second current blocking layer. The first current blocking layer is disposed between the second current blocking layer and the side face of the semiconductor mesa. The second current blocking layer is made of substantially the same material as that of the second semiconductor film in constituent elements and composition of the second semiconductor film.

The quantum cascade semiconductor laser allows the second current blocking layer to dissipate heat through the side face of the semiconductor mesa. The second current blocking layer and the second semiconductor film may be fabricated, for example, using the same growth condition, and the second current blocking layer and second semiconductor film thus grown are the same as each other in terms of constituent elements and compositions.

In the quantum cascade semiconductor laser according to an embodiment, the second current blocking layer and the second semiconductor film constitute a single semiconductor layer.

The quantum cascade semiconductor laser may include the second current blocking layer and the second semiconductor film which can be grown together.

The quantum cascade semiconductor laser according to an embodiment may further include an insulating layer disposed on the reflective layer.

The quantum cascade semiconductor laser allows the insulating layer to protect the reflective layer and enhance the mechanical strength.

In the quantum cascade semiconductor laser according to an embodiment, the substrate includes a first end face and a second end face arranged in the direction of the first axis. The principal surface has a first area and a second area arranged in the direction of the first axis. The semiconductor mesa and the reflective layer are disposed on the first area and the second area, respectively. The second area reaches an upper edge of the first end face of the substrate. The first semiconductor film includes a first portion disposed on the end face, and a second portion disposed on the second area. In addition, the second portion has an edge apart from the upper edge of the first end face.

In the quantum cascade semiconductor laser, the second portion of the first semiconductor film has an edge, which is separated away from the upper edge of the first end face of the substrate. The separation results from the production of the first semiconductor film from a semiconductor layer which does not directly receive a breaking force applied in a separation step of forming the first end face.

Teachings of the present invention can be readily understood by considering the following detailed description with reference to the accompanying drawings shown as examples. Referring to the accompanying drawings, embodiments of a quantum cascade semiconductor laser according to the present invention will be described. To facilitate understanding, identical reference numerals are used, where possible, to designate identical elements that are common to the figures.

First Embodiment

Figure 2:
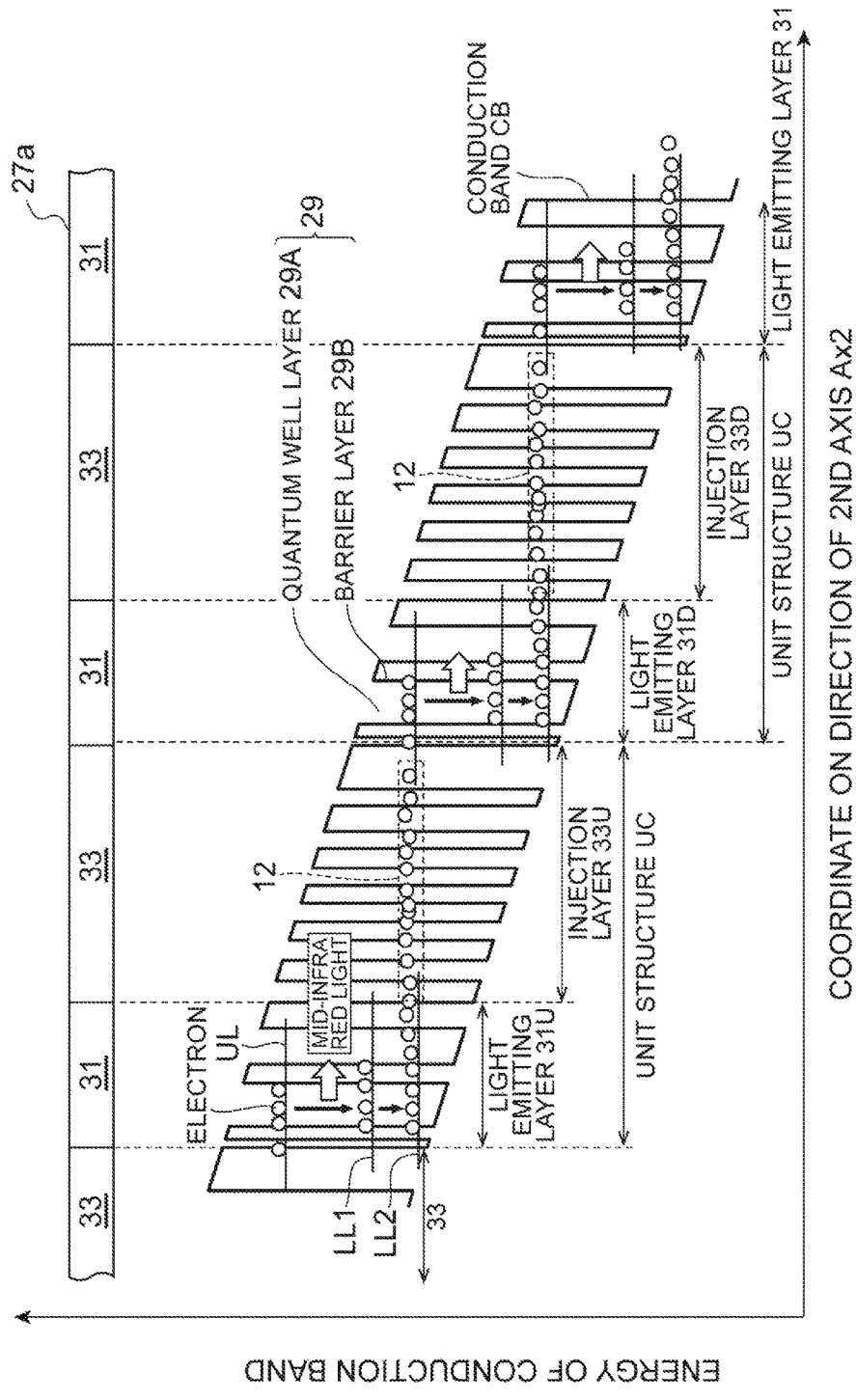
FIG. 2 is a schematic view showing an exemplary core layer for the quantum cascade semiconductor laser according to the present embodiment.
Figure 3:
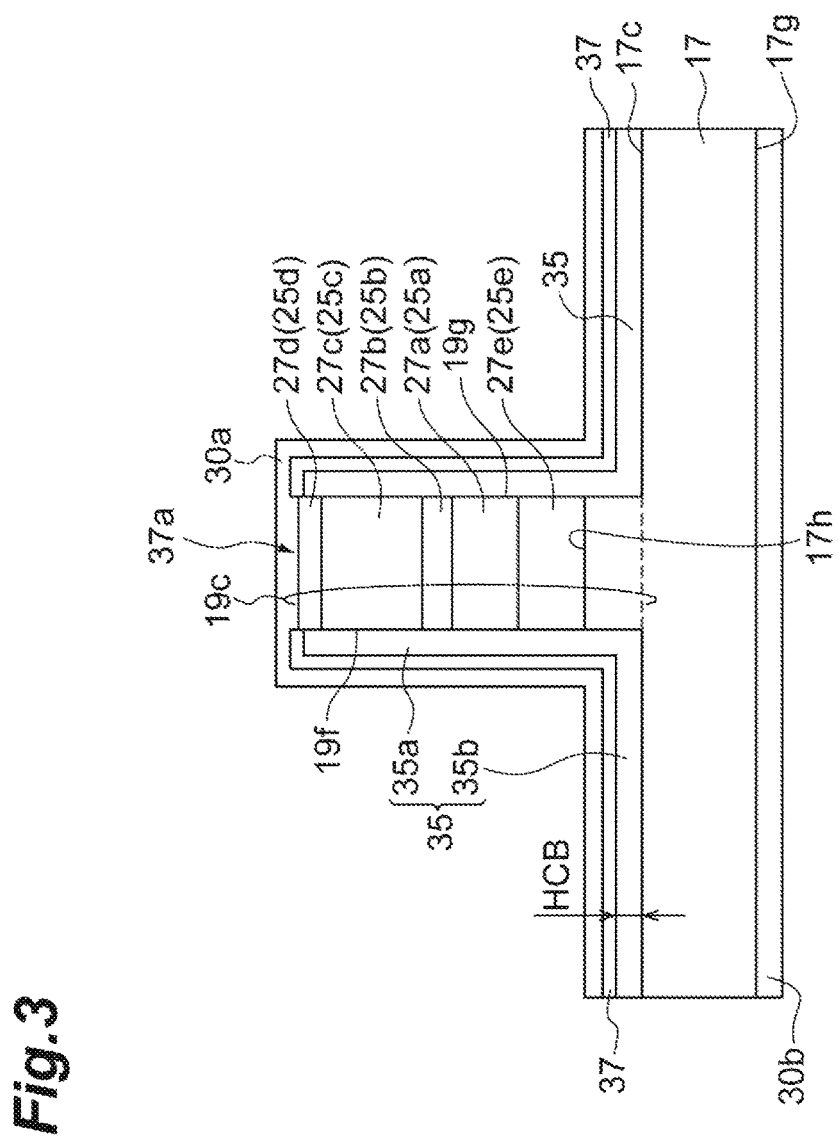
FIG. 3 is a cross-sectional view taken along line III-III shown in FIG. 1.

FIG. 1 is a schematic view showing a distributed feedback quantum cascade semiconductor laser according to the first embodiment. FIG. 2 is a drawing showing an exemplary core layer for the quantum cascade semiconductor laser. FIG. 3 is a cross-sectional view taken along line III-III shown in FIG. 1.

With reference to FIGS. 1 to 3, the quantum cascade semiconductor laser 11 according to the embodiment will be described below. The quantum cascade semiconductor laser 11 includes a laser structure 13 and a reflective layer 15. The laser structure 13 includes a substrate 17 and a semiconductor laminate region 19. The substrate 17 includes a first end face 17a, a second end face 17b, and a principal surface 17c. The first and second end faces 17a and 17b of the substrate 17 are arranged in the direction of a first axis Ax1. The substrate 17 can be, for example, a semiconductor substrate, and specifically, can be an InP substrate of n-type conductivity. In the present embodiment, the substrate 17 has an electrical conductivity. The semiconductor laminate region 19 includes a first mesa end face 19a, a second mesa end face 19b, and a semiconductor mesa 19c. The first and second mesa end faces 19a and 19b extend in the direction of a second axis Ax2 intersecting that of the first axis Ax1. The second axis Ax2 extends in a direction intersecting the principal surface 17c of the substrate 17. The reflective layer 15 forms a junction with an underlying semiconductor region. In the present embodiment, the reflective layer 15 is disposed on each of the first and second mesa end faces 19a and 19b. In another case, the reflective layer 15 may be disposed on one of the first and second mesa end faces 19a and 19b. The reflective layer 15 may include at least one of undoped or semi-insulating semiconductor. Undoped and semi-insulating semiconductors of the first semiconductor film 15a may be in direct contact with the first mesa end face 19a (if necessary, the second mesa end face 19b).

The principal surface 17c of the substrate 17 includes a first area 17d, a second area 17e, and a third area 17f. The first area 17d, the second area 17e, and the third area 17f each extend in the direction of a third axis Ax3 intersecting the directions of the first axis Ax1 and the second axis Ax2, and the third area 17f is disposed between the first area 17d and the second area 17e. In the present embodiment, the third area 17f adjoins both the first area 17d and the second area 17e.

The first area 17d extends from the first mesa end face 19a of the semiconductor mesa 19c to the first end face 17a to connect them with each other, and the second area 17e extends from the second mesa end face 19b of the semiconductor mesa 19c to the second end face 17b to connect them with each other. The first semiconductor film 15a has a first portion 15aa disposed on the first mesa end face 19a (the second mesa end face 19b) and a second portion 15ab disposed on the first area 17d (the second area 17e). The second portion 15ab extends from the first end face 17a (the second end face 17b) along the first area 17d (the second area 17e) to the lower edge of the first mesa end face 19a (the second mesa end face 19b) of the semiconductor mesa 19c.

As shown in FIGS. 1 and 2, the core layer 27a has a superlattice structure 29, which includes one or more quantum well layers 29a and one or more barrier layers 29b. The first semiconductor film 15a of the reflective layer 15 has a band gap equal to or smaller than that of the quantum well layer 29a.

The combination of the core layer 27a with the first semiconductor film 15a, which has a bandgap not more than that of the quantum well layers 29a, can provide the end face of the quantum cascade semiconductor laser 11 with a reflectance that varies with the thickness of the first semiconductor film 15a.

The semiconductor mesa 19c includes a lower cladding layer 27e, a core layer 27a, a diffraction grating layer 27b, an upper cladding layer 27c, and a contact layer 27d, which are grown on the substrate 17. The lower cladding layer 27e, the core layer 27a, the diffraction grating layer 27b, the upper cladding layer 27c, and the contact layer 27d extend from one of the first mesa end face 19a and the second mesa end face 19b to the other. The first semiconductor film 15a covers the end faces of the lower cladding layer 27e, the core layer 27a, the diffraction grating layer 27b, the upper cladding layer 27c, and the contact layer 27d. In addition, the first semiconductor film 15a covers the first substrate end face 17i (the second substrate end face 17j) located at the lower end portion of the first mesa end face 19a. In the present embodiment, the substrate 17 includes a ridge portion 17h, which mounts the lower cladding layer 27e, the core layer 27a, the diffraction grating layer 27b, the upper cladding layer 27c, and the contact layer 27d thereon. The ridge portion 17h extends from the first substrate end face 17i to the second substrate end face 17j.

Quantum cascade semiconductor lasers utilize a unipolar charge, such as electron, as electrical carrier, and electron transition between subbands formed in the conduction band CB produces luminescence. As shown in FIG. 2, the core layer 27a in the quantum cascade semiconductor laser 11 includes light emitting layers 31 (31U, 31D), each of which is provided for light emission, and injection layers 33 (33U, 33D), each of which injects carriers into the adjoining light emitting layer 31 (31U, 31D). The light emitting layers 31 and the injection layers 33 are preferably formed by a superlattice of GaInAs/AlInAs, and they are alternately arranged to form the core layer 27. Each light emitting layer 31 in the superlattice structure provides three subband levels of the upper level UL and the lower level LL1 for the subband transition, and the relaxation level LL2 in total. Each injection layer 33 in the superlattice structure provides a miniband 12. The miniband 12 of the injection layer 33 has an energy width enough to provide a path connecting the relaxation level LL2 upstream of the injection layer 33 to the upper level UL downstream of the injection layer 33. Specifically, the core layer, which includes the quantum well layers 29a and the barrier layers 29b each of which has compositions and thicknesses adjusted to provide an energy difference between the upper and lower levels in the light emitting layer 31, can emit light in mid-infrared wavelengths, for example, 3 to 20 micrometers. The quantum well layers 29a encompass, for example, GaInAs and GaInAsP, and the barrier layers 29b encompass, for example, AlInAs and AlGaInAs. In the present embodiment, the quantum well layers 29a and the barrier layers 29b that include GaInAs and AlInAs enable mid-infrared emission. The core layer 27a, which has the superlattices made of these materials allowing the inter-subband transition in the conduction band thereof, can provide the quantum cascade semiconductor laser 11 with laser oscillation in the mid-infrared wavelength region of 3 to 20 micrometers. The quantum well layers 29a and the barrier layers 29b constitute a unit structure UC.

As shown in FIG. 2, the core layer 27a includes a plurality of unit structures, each of which is referred to as "UC" and includes the light emitting layer 31 and the injection layer 33, and the unit structures UC are stacked in multistage cascades, for example, tens of cycles. Each of the light emitting layer 31 and the injection layer 33 includes a superlattice, and the superlattice includes the quantum well layers 29a each having a thin film with a thickness of several nanometers, and the barrier layers 29b each having a thin film, which has a larger band gap than that of the quantum well layer 29a, with a thickness of several nanometers, and the thin films for the quantum well layers 29a and the thin films for the barrier layers 29b are alternately arranged to form the superlattice.

An electric field is applied to the core layer 27a. The application of the electric field enables the injection of electrons into the upper level UL of the light emitting layer 31U (the light emitting layer 31 on the lower potential side), and the electrons thus injected into the upper level UL make a transition to the lower level LL1. This transition produces light of an emission wavelength equivalent to the energy difference between the above levels. The electrons thus transitioned to the lower level LL1 of the light emitting layer 31U (the light emitting layer 31 on the lower potential side) rapidly release LO phonons to transit to the relaxation level LL2, which is lower than the lower level LL1. The electrons on the relaxation level LL2 are injected into the upper level UL of the light emitting layer 31D (the light emitting layer 31 on the higher potential side) in the next unit structure UC through the injection layer 33U (the injection layer 33). As understood from the above description, the relaxation level LL2 allows the electrons on the lower level LL1 to relax rapidly, and this relaxation keeps carriers on the lower level LL1 depleted, thereby providing the population inversion of carriers between the upper level UL and the lower level LL1. As shown in FIG. 2, the injection layer 33 can work as a path for electron transport, referred to as a miniband 12 composed of multiple dense subband levels, and electrons can pass through this transport path to be injected smoothly into the next light emitting layer 31D (the light emitting layer 31 on the higher potential side). The electrons injected smoothly into the next light emitting layer 31D (the light emitting layer 31 on the higher potential side) are transited to emit light similarly to the light emitting layer 31U, and the electrons thus transited move the light emitting layer 31 in the unit structure UC on the higher potential side. The light emitting transition occurs likewise in each of the multiply-connected unit structures UC to emit light repeatedly. The quantum cascade laser emits a light beam which is produced from the sum of light emissions in the multiply-connected unit structures.

As described above, the core layer 27a has a multiple-stage structure including an alternate arrangement of the light emitting layers 31 and the injection layers 33. Providing the injection layer 33 between the light-emitting layers 31 allows electrons to successively flow from the light-emitting layer on the lower potential side to the light-emitting layer on the higher potential side, thereby enabling the transition between the subbands in the conduction band to efficiently generate light. As understood from this description, the quantum cascade semiconductor laser does not use interband transition but subband transition in the conduction band, in particular electron transition between the subbands in the conduction band to generate light.

The laser structure 13 may include a semiconductor mesa 19c, and another semiconductor mesa different from the semiconductor mesa 19c. The laser structure 13 has a first semiconductor film 25a for the core layer 27a, a second semiconductor layer 25b for the diffraction grating layer 27b, a third semiconductor layer 25c for the upper cladding layer 27c, and a fourth semiconductor layer 25d for the contact layer 27d, and further includes a fifth semiconductor layer 25e for the lower cladding layer 27e. In the present embodiment, as shown in FIGS. 1 and 3, the laser structure 13 includes the semiconductor mesa 19c, and the semiconductor mesa 19c can include the lower cladding layer 27e, the core layer 27a, the diffraction grating layer 27b, the upper cladding layer 27c, and the contact layer 27d. The quantum cascade semiconductor laser 11 includes the diffraction grating GR, which is constituted by the interface between the diffraction grating layer 27b and the upper cladding layer 27c, with a periodic refractive-index change.

The quantum cascade semiconductor laser 11 has a first electrode 30a disposed on the contact layer 27d. Further, the quantum cascade semiconductor laser 11 includes a second electrode 30b making a junction with the rear face 17g of the substrate 17. The first and second electrodes 30a and 30b each can include a metal laminate, for example Ti/Au, Ti/Pt/Au, or Ge/Au. If necessary, the insulating film 37 is disposed between the first electrode 30a and a current blocking layer 35a, and specifically, the first electrode 30a makes contact with the top face of the semiconductor mesa 19c through the opening of the insulating film 37. The insulating film 37 may include a dielectric insulating film, such as $SiO_2$, SiON, SiN, alumina, Benzocyclobutene (referred to as BCB), and polyimide. These films can be deposited by film formation methods, such as sputtering, chemical vapor deposition (CVD), and spin coating. In the present embodiment, the first electrode 30a is disposed on a first side face 19f and a second side face 19g of the semiconductor mesa 19c, and allows heat to dissipate from the semiconductor mesa 19c. In addition, the first electrode 30a extends on the principal surface 17c of the substrate 17 continuously from the first and second side faces 19f and 19g. The first electrode 30a is disposed on the third area 17f, allowing the dissipation of heat from the semiconductor mesa 19c.

Referring to FIG. 3, the quantum cascade semiconductor laser 11 includes a current blocking layer 35 in an embedding region, which embeds the side face of the semiconductor mesa. In the present embodiment, the current blocking layer 35 includes a first portion 35a, which works as a first current blocking layer, disposed on the side faces 19f and 19g of the semiconductor mesa 19c, and a second portion 35b extending from the bottom edges of the first and second side faces 19f and 19g to the side edge of the third area 17f. In the present embodiment, the first portion 35a covers the first and second side faces 19f and 19g. The quantum cascade semiconductor laser 11 may have a buried heterostructure as shown in FIG. 3. The current blocking layer 35 is disposed on the side faces 19f and 19g of the semiconductor mesa 19c to confine current into the semiconductor mesa 19c. The current blocking layer 35 includes a high resistance semiconductor, which can be, for example, an undoped or semi-insulating semiconductor. It is preferable that the semi-insulating semiconductor be formed by doping a group III-V compound semiconductor with a transition metal (for example, Fe, Ti, Cr, or Co). InP doped with, for example, Fe dopant can provide a semiconductor with a high specific resistance of, for example, $10^5$ Ωcm or more to electron, and function well as the current blocking layer 35. If possible, the current blocking layer may include an undoped semiconductor. In the buried heterostructure shown in FIG. 3, the current blocking layer 35 has not only a first portion 35a on the side face of the mesa but also a second portion 35b on the principal surface 17c of the substrate 17. The current blocking layer 35 can have an appropriate thickness HCB, and for example, the current blocking layer 35 is grown to be as high as the height of the semiconductor mesa 19c, and the HCB can be set to a height allowing the device to have a flat surface.

Current blocking layer 35: undoped or semi-insulating InP, GaInAsP, AlGaInAs, AlInAs, and GaInAs.

In the present embodiment, the current blocking layer 35 can include the first semiconductor film 15a, which is disposed on the side face of the semiconductor mesa 19c, acting as the first portion 35a.

The current blocking layer 35 may include the same semiconductor material as the first semiconductor film 15a. The current blocking layer 35 and the first semiconductor film 15a are formed together in the same growing step. The formation in the same growing process simplifies the fabrication process to improve the productivity and reduce the production cost.

In the present embodiment, the current blocking layer 35 can include the first semiconductor film 15a, acting as the first portion 35a, which is disposed on the side face of the semiconductor mesa 19c. The current blocking layer is disposed on the side face of the semiconductor mesa 19c to confine current into the semiconductor mesa 19c. The current blocking layer 35 includes a high resistance semiconductor, and the high resistance semiconductor can be, for example, an undoped or semi-insulating semiconductor.

The current blocking layer 35 in the following description may include the same semiconductor material as the first semiconductor film 15a. The first semiconductor film 15a is disposed on the first and second side faces 19f and 19g of the semiconductor mesa 19c such that the side face of the core layer 27a of the semiconductor mesa 19c is covered with a semiconductor layer of a high refractive index. This coverage allows the diffusion and distribution of light guided in the semiconductor mesa 19c to reduce the optical density in the waveguide. This reduction in the optical density makes it possible to suppress spatial hole burning and the occurrence of COD, thereby providing the quantum cascade laser with improved output characteristics and reliability. The first semiconductor film 15a is in direct contact with the first and second side faces 19f and 19g. The first semiconductor film 15a may include at least one of an undoped semiconductor or a semi-insulating semiconductor. The undoped and semi-insulating semiconductors in contact with the first mesa end face 19a of the semiconductor mesa 19c can reduce a leakage current through the interface between the first mesa end face 19a and the first semiconductor film 15a (the reflective layer 15), and optical absorption caused by free carriers in the semiconductor film 15a (the reflective layer 15). In addition, the undoped and semi-insulating semiconductors extending along the first and second side faces 19f and 19g can avoid a leakage current through the interface between the first and second side faces 19f and 19g and the first semiconductor film 15a (the current blocking layer 35), and light absorption caused by free carriers in the first semiconductor film 15a (the current blocking layer 35).

EXAMPLE

An exemplary quantum cascade semiconductor laser 11 will be described with reference to FIGS. 1, 2 and 3. The quantum cascade semiconductor laser 11 includes a body region and outer regions provided on both sides of the body region. The body region is located in the central region of the device, and includes a waveguide mesa structure for lasing, which has a buried heterostructure made of the semiconductor mesa 19c and the current blocking layer 35. The waveguide mesa structure has a mesa end face of the semiconductor covered with the reflective layer 15. The first semiconductor film 15a on the first mesa end face 19a of the semiconductor mesa 19c works as an end face of the lasing cavity. In the present embodiment, the reflective layer 15 is disposed on each of the first and second mesa end faces 19a and 19b of the semiconductor mesa 19c to form a mirror structure for the optical cavity.

The substrate 17 may be, for example, a semiconductor substrate, and can be, for example, an n-type InP substrate. The substrate 17 can be conductive. Semiconductor layers providing the mid-infrared quantum cascade semiconductor laser have lattice constants which are the same as or close to the lattice constant of the InP semiconductor, and the InP substrate can provide excellent crystal growth of the lower cladding layer 27e, the core layer 27a, the diffraction grating layer 27b, the upper cladding layer 27c, and the contact layer 27d, which are grown thereon. These semiconductor layers can be grown by, for example, organometallic vapor phase epitaxy or molecular beam epitaxy. InP is substantially transparent to mid-infrared light, so that InP is used as a lower cladding layer.

The upper and lower cladding layers 27c and 27e can be provided with, for example, n-type InP, and InP is a binary mixed crystal lattice-matched to InP of the substrate. The upper and lower cladding layers 27c and 27e both made of InP provide a favorable crystal growth for cladding layers on the basal InP substrate. The cladding layers of InP ensure good dissipation of heat from the core layer in view of thermal conductivity of InP.

The diffraction grating layer 27b can provide a distributed feedback structure allowing the quantum cascade laser to lase in a single mode. The diffraction grating extends in the direction of the first axis Ax1, and the diffraction grating structure is formed by photolithography and etching. The diffraction grating has a Bragg wavelength associated with the period PRD thereof, and reflects light of the Bragg wavelength selectively, and the optical cavity amplifies the light. This structure enables single mode oscillation. In order to provide the diffraction grating with a large coupling coefficient, the diffraction grating layer 27b may be made of, for example, undoped or n-type GaInAs of a high refractive index.

The contact layer 27d can form an excellent ohmic contact with the first electrode 30a. The contact layer 27d may include, for example, n-type GaInAs, which has a small bandgap and can be lattice-matched to InP. The contact layer 27d is optional.

If necessary, an optical confinement region may be provided between the core layer 27a and the diffraction grating layer 27b and/or between the core layer 27a and the lower cladding layer 27e. The optical confinement region allows strong confinement of light guided in the core region. The optical confinement region is made of a semiconductor material, which is preferably lattice-matched to InP, with a refractive index higher than that of the cladding layer. The optical confinement region may include, for example, undoped or n-type GaInAs.

The first semiconductor film 15a that constitutes the reflective layer 15 can avoid degradation, caused by oxidation of constituent elements of the semiconductor at the end face of the optical cavity (the end face of the waveguide). In order to prevent absorption of light due to interband absorption of the first semiconductor film 15a, the first semiconductor film 15a is made of material having a bandgap energy higher than the photon energy of emission light in the core layer 27a. In order to avoid oxidation of the reflective layer 15, the first semiconductor film 15a may include a group III-V compound semiconductor containing no aluminum as a constituent element, such as GaInAs or GaInAsP. The addition of a transition metal (e.g., Fe) to GaInAs and GaInAsP makes them highly resistive. The first semiconductor film 15a is grown on the mesa end faces 19a and 19b and the third area 17f, and the film thickness of the first semiconductor film 15a is in the range of 0.5 to 10 micrometers on the first area 17d.

The first semiconductor film 15a is made of a semiconductor material having a bandgap equal to or smaller than that of the quantum well layer in the core layer 27a. The first semiconductor film 15a, which may be exposed to the atmosphere, is desirably made of a group III-V compound semiconductor that contains no aluminum as a constituent element and encompasses, for example, GaInAs and GaInAsP. The material can be substantially the same as the material of the quantum well layer in the core layer. Aluminum contained as a constituent element in the first semiconductor film 15a in contact with the end faces (19a and 19b) of the semiconductor mesa 19c may react with oxygen and/or moisture in the atmosphere. This reactions produce crystal defects in the first semiconductor film 15a. Such crystal defects act as non-radiative recombination centers. An increase in the number of non-radiative recombination centers results in an increase in threshold current and a decrease in optical output. The non-radiative recombination centers are a cause of end face deterioration occurring in electrostatic discharge (ESD) and optical damage (catastrophic optical damage: COD), which can degrade reliability. It is preferable that the first semiconductor film 15a should use a group III-V compound semiconductor containing no aluminum, such as GaInAs or GaInAsP. It is also preferable that the first semiconductor film 15a be formed of a semiconductor material with high resistance, for example, an undoped or semi-insulating semiconductor. In semi-insulating semiconductors, for example, a transition metal, such as Fe, Ti, Cr, or Co, is added to a host III-V compound semiconductor, and this addition forms deep levels in the forbidden band of the III-V compound semiconductor. The deep levels can trap electrons, and the trapping of electrons can provide semi-insulating properties. In many cases, iron (Fe) is used as the transition metal to be added. Doping this transition metal can provide high resistance of, for example, $10^5$ Ωcm or more to electrons. Alternatively, if the high resistance of an undoped semiconductor is accepted in a device, the first semiconductor film 15a may include an undoped semiconductor. The first semiconductor film 15a of high specific resistance can reduce a leakage current flowing through the reflective layer 15 during operation of the device. The reflective layer 15 is formed by doping a semiconductor having the same composition as that of the semiconductor of the quantum well layer 29a with a transition metal, such as Fe, as an impurity. For example, the semiconductor can include GaInAs and/or GaInAsP.

Emission of a semiconductor laser with a pn junction, for example, a semiconductor laser for optical communications, utilizes the interband transition of electron between the conduction band and the valence band of the quantum well layer of the core layer in the semiconductor mesa. This light emitting mechanism of the interband transition generates light of a wavelength approximately equal to the bandgap of the quantum well layer. The reflective layer on the end face of the semiconductor mesa may be made of semiconductor material, which has a higher bandgap than that of the quantum well layer, to prevent an interband transition inherent in the reflective layer from absorbing outgoing light, thereby enabling the optical cavity.

Similarly, a reflective layer can be provided on the end face of a quantum cascade semiconductor laser which generates light of a longer wavelength than that of the semiconductor laser for optical communications. The reflective layer of a semiconductor with a higher bandgap has a lower refractive index than that of the core layer of the semiconductor mesa. The quantum cascade semiconductor laser can use the reflective layer of semiconductor with the high bandgap on the end face of the semiconductor mesa thereof, and the end face of the mesa is covered with the semiconductor layer of the low refractive index. The inventor's teachings reveal that the coating of a semiconductor layer with a lower refractive index has an end face reflectance that is significantly smaller than that of the coating of a semiconductor layer with a higher refractive index.

Inventor's studies reveal that the, the quantum cascade semiconductor laser utilizes a subband transition in the conduction band that can generate light of a longer wavelength than that of the semiconductor laser for optical communications. The subband transition produces light of a wavelength longer than the wavelength that is associated with the photon energy of the electron transition between the conduction and valence bands of the quantum well layer in the core layer, and hence the quantum well layer cannot absorb the light produced from the subband transition of the quantum cascade semiconductor laser. The core layer of the quantum cascade semiconductor laser has a superlattice including not only the quantum well layer but also a barrier layer of a higher bandgap and a lower refractive index than that of the quantum well layer. The refractive index averaged over the quantum well and barrier layers in the superlattice is smaller than that of the semiconductor material of the quantum well layer.

The photon energy of mid-infrared light emitted by inter-subband transition is much smaller than the bandgap energy of the III-V compound semiconductor of the quantum well layer of the core layer. The reflective layer including the III-V compound semiconductor of a bandgap energy lower than that of the quantum well layer of the core layer cannot absorb mid-infrared light produced by the inter-subband transition. But, the reflective layer has a larger refractive index of the III-V compound semiconductor than the average refractive index of the superlattice of the core layer.

In addition, the reflective layer may have one or more constituent elements corresponding to one or more constituent elements of the quantum well layer of the core layer, and this similarity in constituent element makes it easy to grow crystal of the reflective layer on the end face of the core layer of the semiconductor mesa. Preferably, the reflective layer may have the same constituent elements as those of the quantum well layer of the core layer, and the same constituent elements prevents structural crystal defects from occurring in growing crystal on the end face of the semiconductor mesa.

Providing the semiconductor reflective layer, which has a lower bandgap than that of the quantum well layer in the core layer, on the end face of the semiconductor mesa is not applicable to a semiconductor laser with the pn junction that utilizes the interband transition between the conduction and valence bands of the quantum well layer of the active layer, and is unique to quantum cascade semiconductor lasers.

Reflectivity of the end facet of the cavity is calculated by plane wave approximation using a model of a quantum cascade semiconductor laser having the following structure (a model of a distributed feedback type quantum cascade semiconductor laser, having the structure shown in FIG. 1, of 7.23 micrometer band). The device structure of the present example (the dependence of the end face reflectance on the thickness of the reflective film is referred to as "Structure P").

Lasing wavelength in vacuum: 7.23 micrometers.
Substrate: n-InP.

Core layer: Superlattice including an array of GaInAs quantum well layers/AlInAs barrier layers, where GaInAs and AlInAs are lattice-matched to InP.
Upper cladding layer: n-type InP.
Lower cladding layer: n-type InP.
Diffraction grating layer: n-type GaInAs.
Contact layer: n-type GaInAs.
First semiconductor film: Fe-doped GaInAs.

Another structure (the dependence of reflectance on the thickness of the facet film is referred to as "Structure C").
End face film on mesa end face: InP.

Figure 4:
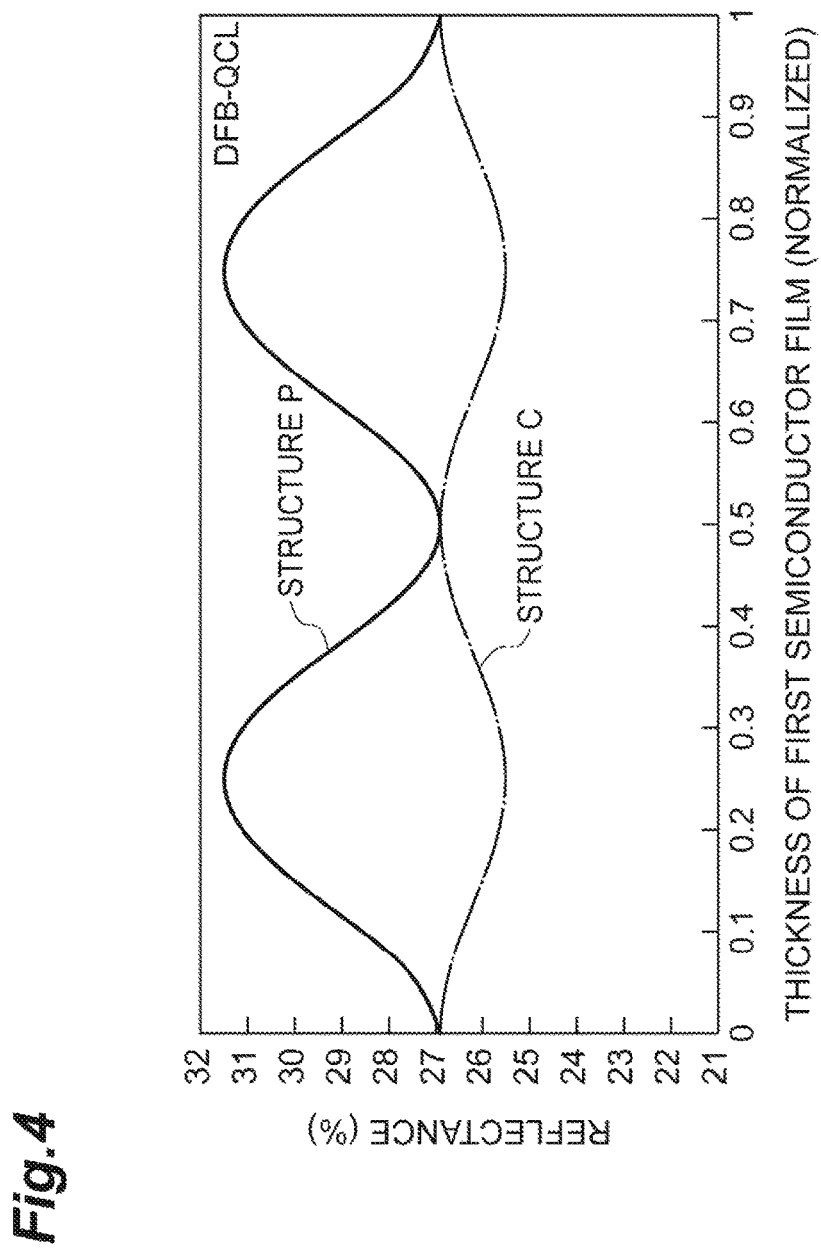
FIG. 4 is a graph showing the dependency of reflectance on the thickness of films in the structure P (with a single semiconductor film on the end face) and the structure C (with an InP film on the end face).

FIG. 4 shows the film thickness dependency of the reflectance in Structure P and Structure C. The horizontal axis of FIG. 4 represents the thickness of the film formed on the end face (the thickness on the horizontal axis is normalized by the ratio (RAMD/n) of the lasing wavelength "RAMD" to the refractive index "n" of the first semiconductor film at the lasing wavelength RAMD), and the vertical axis represents the reflectance of the end face.

The calculated reflectance (Structures P and C) varies with a period of 0.5×(RAMD/n) with respect to the film thickness on the horizontal axis.

The reflectance of Structure C is equal to or less than 26.9%, which is taken at a thickness of zero of the reflective film, over any film thickness, and the reflectance is lowest at the film thickness of 0.25×(RAMD/n).

The reflectance of Structure P is not less than 26.9%, which is taken at a thickness of zero of the reflective film, over any film thickness. The reflectance of the first semiconductor film at a thickness of 0.25×(RAMD/n) is 31.5%, and is much larger than the value obtained at the thickness of zero.

In Structure P, the first semiconductor film on the end facet of the semiconductor mesa can provide the end of the optical cavity with an enhanced reflectance. The enhanced reflectance can reduce the threshold current. Specifically, the first semiconductor film is disposed on the rear face to enable a high reflection thereat. Accordingly, the structure that have a higher reflectance of the rear face makes a marked difference in reflectance between the front and rear faces to allow the semiconductor laser to operate in a single mode operation.

The first semiconductor film of the reflective layer may include a semiconductor material, such as GaInAsP or GaInAs, which is the same as that of the quantum well layer of the core layer, and atoms of the first semiconductor film on the core end of the mesa end facet are chemically bonded to those of the quantum well layer of the core layer to form the interface between the first semiconductor film and the quantum well layer, thereby making the first semiconductor film and the quantum well layer crystallographically integrated. This can prevent dangling bonds from occurring at the interface to reduce defects at the interface. Semiconductor materials for the quantum well layer and the first semiconductor film may have respective compositions containing common constituent elements (Ga, In, As), and may be, for example, a combination of GaInAs and GaInAs, and their conductivity types may not be the same as each other. The first semiconductor film of the reflective layer including an undoped or semi-insulating semiconductor can reduce optical loss due to free electron absorption. Preferably, the semiconductor material of the first semiconductor film of the reflective layer has a bandgap energy in a range of equal to or less than the value that is obtained by converting the lasing wavelength of the quantum cascade semiconductor laser to energy.

Second Embodiment

Figure 5:
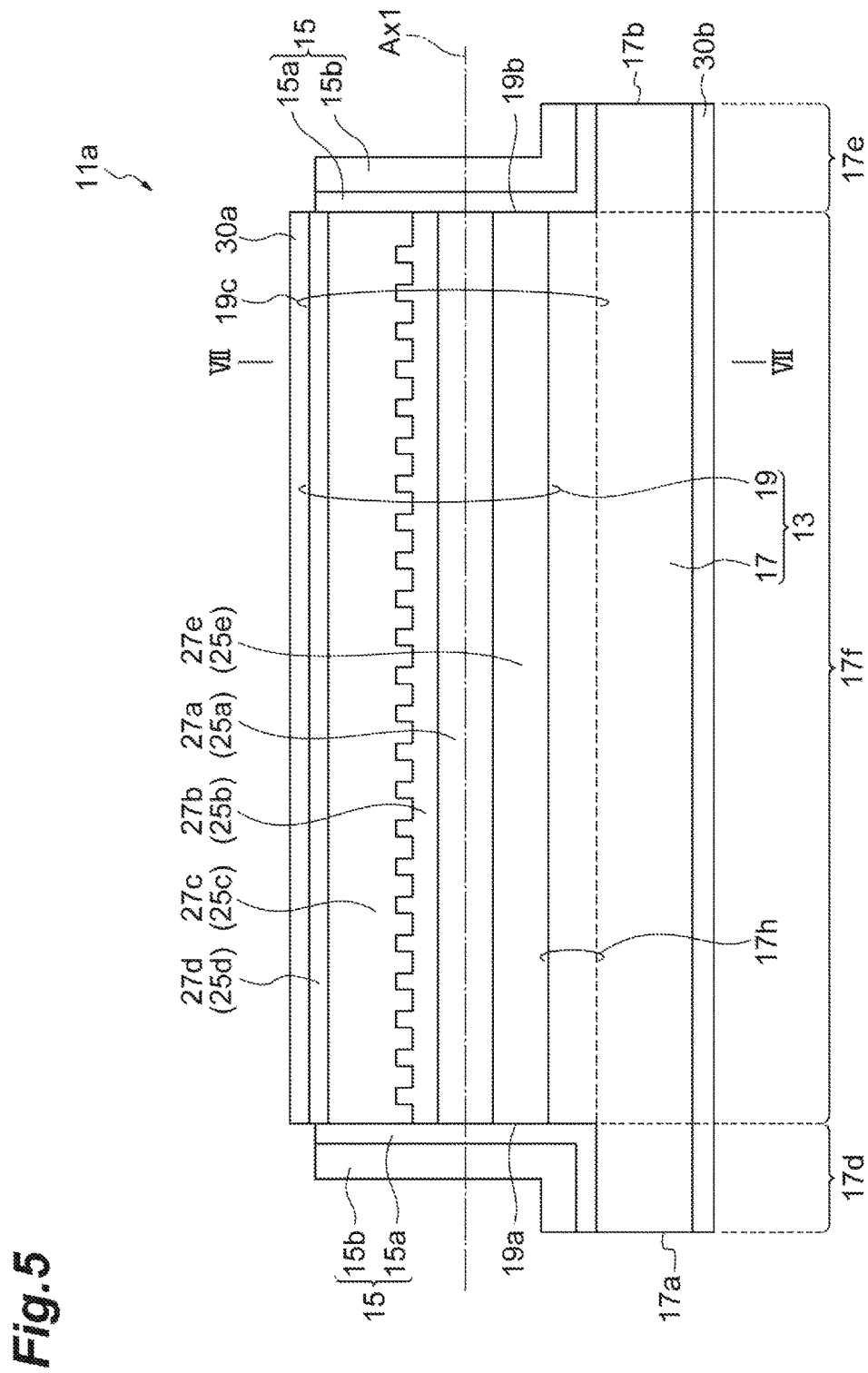
FIG. 5 is a schematic view showing a quantum cascade semiconductor laser according to the second embodiment.

FIG. 5 is a schematic cross-sectional view showing a quantum cascade semiconductor laser according to the second embodiment. The cross section shown in FIG. 5 is taken along a line equivalent to that of the cross section of FIG. 1, which shows the quantum cascade semiconductor laser according to the first embodiment. In the quantum cascade semiconductor laser 11a, the reflective layer 15 includes multiple semiconductor films. Specifically, the reflective layer 15 may include a first semiconductor film 15a and a second semiconductor film 15b. The second semiconductor film 15b is disposed on the first semiconductor film 15a, which is on the first mesa end face 19a of the semiconductor mesa 19c.

The first semiconductor film 15a includes a semiconductor material of the bandgap which is the same as or smaller than that of the quantum well layer, and may include the same material as the quantum well layer, for example, GaInAs and/or GaInAsP. These semiconductor materials are ternary mixed crystals or quaternary mixed crystals, and the ternary and quaternary mixed crystals each have a smaller thermal conductivity than that of the binary mixed crystal. Accordingly, the first semiconductor film 15a exhibits a smaller thermal conductivity than that of the binary mixed crystal. In order to compensate for the small thermal conductivity of the material of the first semiconductor film 15a, the material of the second semiconductor film 15b preferably has constituent elements the number of which is smaller than those of the first semiconductor film 15a. Specifically, the first semiconductor film 15a of a quaternary mixed crystal can be combined with the second semiconductor film 15b of a binary or ternary mixed crystal. The first semiconductor film 15a of a ternary mixed crystal can be combined with the second semiconductor film 15b of a binary mixed crystal. InP is a typical binary mixed crystal, and has a high thermal conductivity, and the second semiconductor film 15b of InP can avoid poor heat dissipation and/or temperature rise at the end face, which are caused by the coating of the first mesa end face 19a of the semiconductor mesa 19c, to suppress deterioration in device performances and end face deterioration. The thermal conductivity of InP is higher than that of GaInAs and GaInAsP by about one order of magnitude. The first semiconductor film 15a is made of an undoped or semi-insulating semiconductor. Further, preferably, the second semiconductor film 15b is made of an undoped or semi-insulating semiconductor, an exemplary binary mixed crystal of which is Fe-doped InP.

Film thickness of the first semiconductor film 15a: for example, 0.5 to 10 micrometers.
Film thickness of the second semiconductor film 15b: for example, 0.5 to 10 micrometers.

In order to provide the reflective layer 15 with an excellent thermal conductivity, preferably, the thickness of the first semiconductor film 15a is made smaller than that of the second semiconductor film 15b. The first semiconductor film 15a can provide the reflective layer 15 with an improved optical reflection in terms of reflectance, and the second semiconductor film 15b can provide the reflective layer 15 with an improved dissipation of heat in terms of thermal conductivity.

Exemplary Combination of Materials
First semiconductor film 15a, second semiconductor film 15b.
GaInAsP, GaInAs and/or InP.
GaInAs, InP.
GaInAs and/or GaInAsP, InP.

The multilayered reflective layer can provide a wide wavelength range of high reflectance, an excellent thermal conductivity, and a desired mechanical strength. The multilayer reflective layer effectively suppresses temperature rise and deterioration in heat dissipation at the end face.

Figure 6:
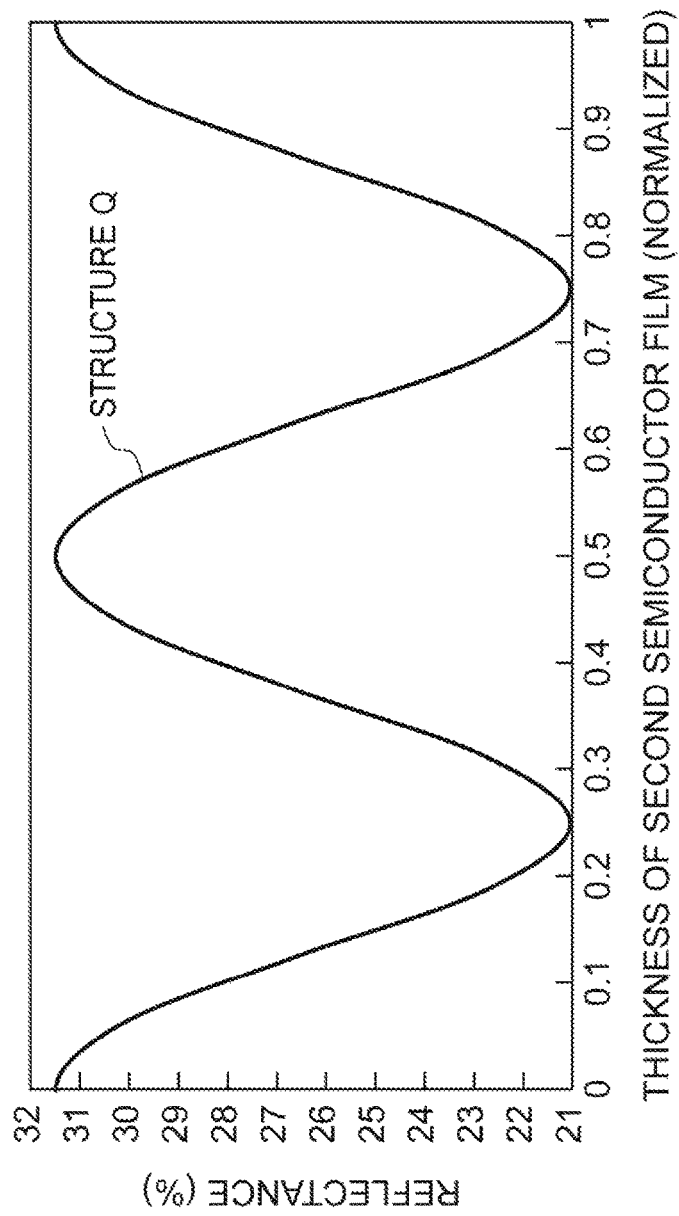
FIG. 6 is a graph showing the dependency of reflectance on the thickness of films in the structure Q (with two semiconductor films) and the structure C (with an InP film on the end face).

FIG. 6 shows the dependency of the reflectance on the film thickness in Structure Q (two-layered semiconductor film). In FIG. 6, the dependence of the end face reflectance on the thickness of the second semiconductor film 15*b* made of InP is calculated using a model including the first semiconductor film 15*a* made of GaInAs and having a thickness of 0.25×(RAMD/n), where "RAMD" represents the lasing wavelength, and "n" represents the refractive index of GaInAs at the lasing wavelength RAMD. The horizontal axis in FIG. 6 represents the thickness of the second semiconductor film of the reflective layer (the thickness on the horizontal axis is normalized by the ratio (RAMD/n) of the lasing wavelength "RAMD" to the refractive index "n" of the second semiconductor film (InP film) at the lasing wavelength RAMD), and the vertical axis represents the reflectance. Structure Q includes a GaInAs film having a thickness of 0.25×(RAMD/n) used as the first semiconductor film 15*a*, and an InP film used as the second semiconductor film 15*b*. Both Structures P and Q each have a larger variable range of the reflectance than that of Structure C of FIG. 4 in reflection characteristics. In order to obtain a high reflectance at the end face, the reflective layer includes the second semiconductor film having a thickness set in the vicinity of 0.5×(RAMD/n). In order to obtain a low reflectance at the end face, the reflective layer includes the second semiconductor film having a thickness set in the vicinity of 0.25×(RAMD/n) and 0.75×(RAMD/n). These settings can provide the mesa end face with a reflectance far from the above value of 26.9%.

Figure 7:
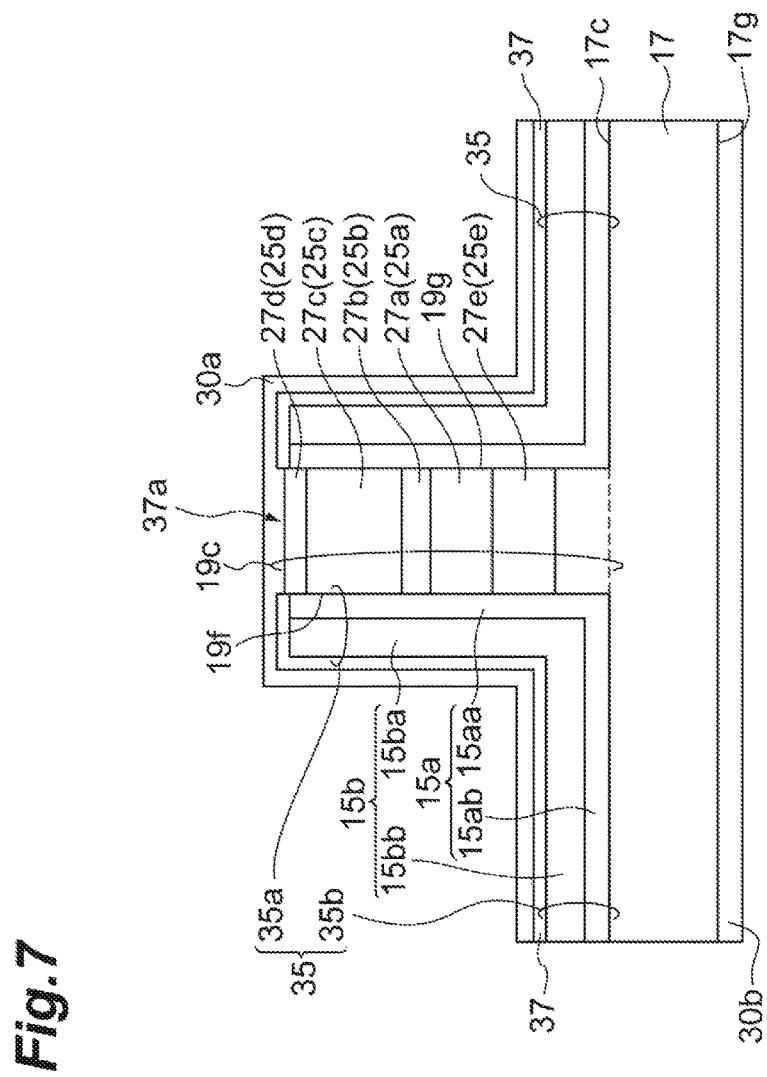
FIG. 7 is a cross-sectional view taken along line VII-VII shown in FIG. 5.

FIG. 7 is a cross-sectional view taken along the line VII-VII shown in FIG. 5. The quantum cascade semiconductor laser 11*a* may have a buried heterostructure as shown in FIG. 7. Specifically, the quantum cascade semiconductor laser 11*a* includes a current blocking layer 35. In the present embodiment, the current blocking layer 35 includes a first portion 35*a* disposed on the side face of the semiconductor mesa 19*c* to form first and second current blocking layers, and a second portion 35*b* extending on the principal surface 17*c* from the lower ends of the first and second side faces 19*f* and 19*g* to the respective side edges of the third area 17*f*. In the present embodiment, the first portion 35*a* covers the first and second side faces 19*f* and 19*g*. The current blocking layer 35 is disposed on the side faces of the semiconductor mesa 19*c* to confine current into the semiconductor mesa 19*c*. The current blocking layer 35 also includes a high-resistive semiconductor, which can be, for example, an undoped or semi-insulating semiconductor. Preferably, the high-resistance semiconductor is obtained by doping a III-V group compound semiconductor with a transition metal (for example, Fe, Ti, Cr, Co) to form a semi-insulating semiconductor. InP doped with, for example, Fe dopant can provide a semiconductor with a high specific resistance of, for example, $10^5$ Ωcm or more to electron, and function well as the current blocking layer 35. If possible, the current blocking layer may include an undoped semiconductor. Current blocking layer 35: for example, undoped or semi-insulating InP, GaInAsP, AlGaInAs, AlInAs, and GaInAs.

In the present embodiment, the current blocking layer 35 may include the first and second semiconductor films 15*a* and 15*b* disposed on the sides of the semiconductor mesa 19*c*. The current blocking layer 35 may include the same semiconductor material as the reflective layer 15, and can have the same laminate structure as the reflective layer 15. The current blocking layer 35 is formed in the step of forming the first semiconductor film 15*a* and the second semiconductor film 15*b*. This simultaneous formation can simplify the fabrication process, leading to improvement in productivity and reduction in production cost.

In the buried heterostructure shown in FIG. 7, the first portion 35*a* of the current blocking layer 35 may include a first portion 15*aa* of the first semiconductor film 15*a* and a first portion 15*ba* of the second semiconductor film 15*b*, and the second portion 35*b* of the current block layer 35 may include a second portion 15*ab* of the first semiconductor film 15*a* and a second portion 15*bb* of the second semiconductor film 15*b*.

In the following description, the current blocking layer 35 includes the same semiconductor materials as the first and second semiconductor films 15*a* and 15*b*. The current blocking layer 35 is formed in the step of forming the first and second semiconductor films 15*a* and 15*b*. This simultaneous formation can simplify the fabrication process, leading to improvement in productivity and reduction in production cost.

The first and second semiconductor films 15*a* and 15*b* are disposed on the first and second side faces 19*f* and 19*g* of the semiconductor mesa 19*c*, so that the first semiconductor film 15*a* of a high reflective material covers the side faces of the core layer 27*a* of the semiconductor mesa 19*c*. This coverage with the first semiconductor film 15*a* can broaden the light guided by the semiconductor mesa 19*c* to reduce the optical density in the waveguide. The reduced optical density can suppress the occurrence of phenomena, such as spatial hole burning and COD, to provide the improvement of optical output characteristics and reliability of the quantum cascade laser. The first semiconductor film 15*a* makes contact with the first and second side faces 19*f* and 19*g*. The first semiconductor film 15*a* includes at least one of an undoped semiconductor or a semi-insulating semiconductor, so that the undoped and semi-insulating semiconductors in direct contact with the first and second side faces 19*f* and 19*g* can reduce a leakage current at the interfaces between the two side faces 19*f* and 19*g* and the first semiconductor film 15*a*. In addition, since undoped and semi-insulating semiconductors have low carrier concentrations, so that the undoped and semi-insulating semiconductors that extend along the first and second side faces 19*f* and 19*g* exhibit a low optical absorption caused by free carriers.

If necessary, the insulating film 37 is disposed between the first electrode 30*a* and the second semiconductor film 15*b*. This insulating film 37 can include dielectric insulating films, such as $SiO_2$, SiON, SiN, alumina, BCB, and polyimide, as already listed above. These dielectric insulating films can be formed by a film formation method, such as sputtering, chemical vapor deposition (CVD), or spin coating. The quantum cascade semiconductor laser 11*a* includes a first electrode 30*a* disposed on the contact layer 27*d*. Specifically, the first electrode 30*a* makes contact with the top face of the semiconductor mesa 19*c* via the opening 37*a* of the insulating film 37.

Third Embodiment

Figure 8:
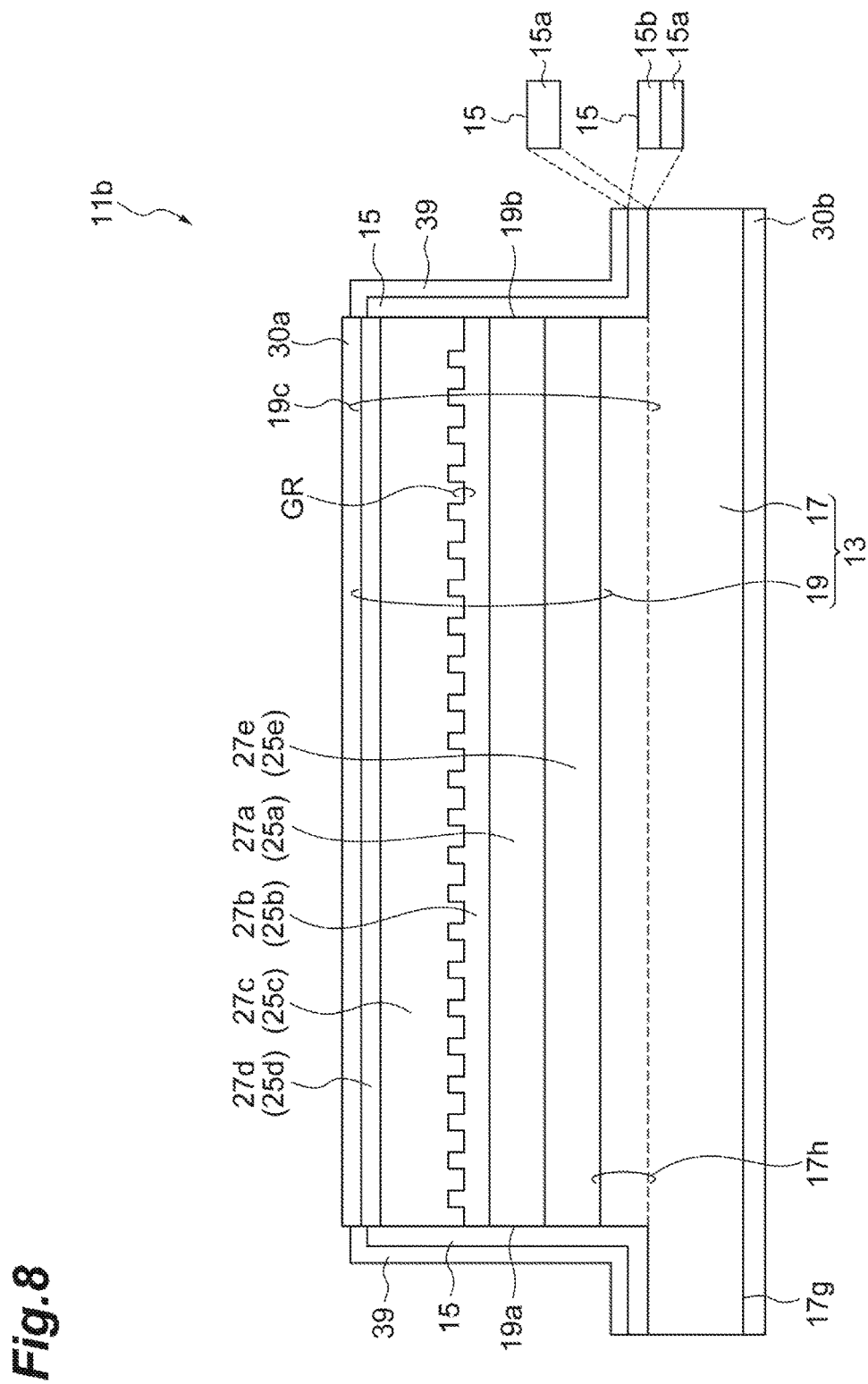
FIG. 8 is a view showing a quantum cascade semiconductor laser according to the third embodiment.

FIG. 8 is a cross section showing the quantum cascade semiconductor laser according to the third embodiment. The cross section of FIG. 8 is taken along a line equivalent to that of FIG. 1, which shows the quantum cascade semiconductor laser according to the first embodiment. The quantum cascade semiconductor laser 11*b* may further include an insulating film 39 disposed on the reflective layer 15. This insulating film 39 may include a dielectric insulating film, such as $SiO_2$, SiON, SiN, alumina, BCB, and polyimide. These dielectric insulating films can be formed by a film formation method, such as sputtering, chemical vapor deposition (CVD), and spin coating. The reflective layer 15 according to the third embodiment can be either the first semiconductor film 15a shown in the first embodiment or the first and second semiconductor films 15a and 15b shown in the second embodiment.

The insulating film 39 covering the reflective layer 15 can prevent the reflective layer 15 from being cracked and chipped by vibrations and shocks, and can increase the mechanical strength of the quantum cascade semiconductor laser 11b.

In addition, the insulating film 39 may be formed in the step of forming the insulating film 37, which is disposed between the current blocking layer 35 and the first electrode 30a. This simultaneous formation simplifies the fabrication process, thereby improving the productivity and reducing the production cost.

In the present embodiment, the insulating film 39 is disposed on both the first and second end faces 19a and 19b of the semiconductor mesa. The insulating film 39 may be, however, disposed on either the first end face 19a or the second end face 19b.

Fourth Embodiment

Figure 9:
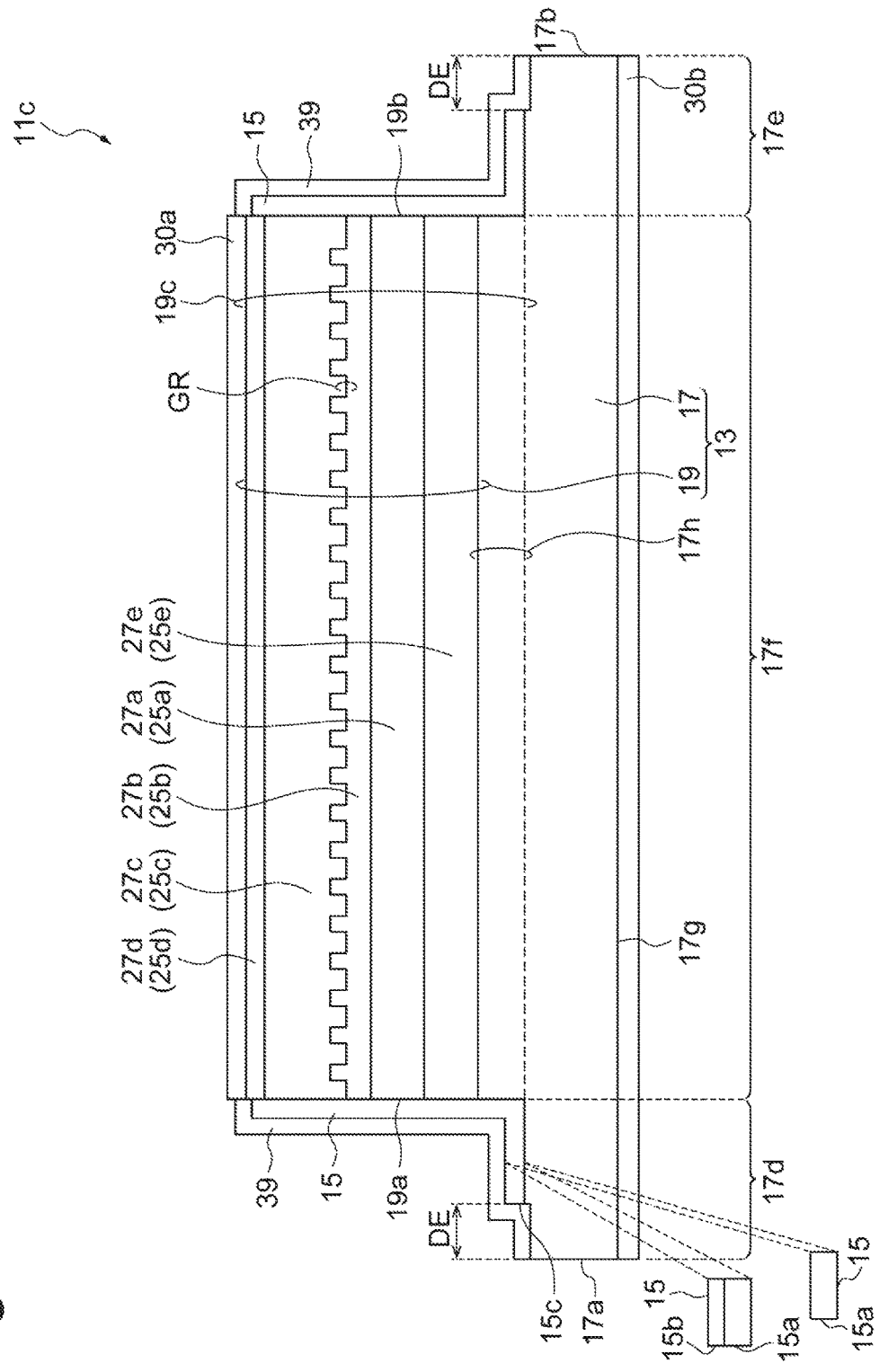
FIG. 9 is a view showing a quantum cascade semiconductor laser according to the fourth embodiment.

FIG. 9 is a cross section showing the quantum cascade semiconductor laser according to the fourth embodiment. The cross section of FIG. 9 is taken along a line equivalent to that of FIG. 1, which shows the quantum cascade semiconductor laser according to the first embodiment. In the quantum cascade semiconductor laser 11c, the reflective layer 15 has an edge 15c apart from the first end face 17a (the second end face 17b) in the first area 17d (the second area 17e). The distance DE can range, for example, from 5 to 50 micrometers.

In the fabrication of the quantum cascade semiconductor laser 11c, the following processes produce a wafer product: epitaxial growth by crystal growth, mesa formation by photolithography and etching, selective growth (and processing) of semiconductor films for the reflective layer and current blocking layers, formation of a protective film, and metallization. The wafer product is divided by, for example, cleaving to form a laser bar(s) and a semiconductor chip(s). In the quantum cascade semiconductor laser 11c, the edge 15c of the reflective layer 15 is also apart from the first end face 17a (the second end face 17b) formed along a breakage line in the dividing step, so that a pressing force applied in the dividing step does not damage the reflective layer 15. The dividing step forms the laser bar(s) and/or the semiconductor chip(s) while preventing the pressing force in the dividing step from separating the semiconductor thin film for the reflective layer into the laser bar(s) and/or the semiconductor chip(s).

In the quantum cascade semiconductor laser 11c, the end 15c of the reflective layer 15 is apart from the first and second end faces 17a and 17b. The distance between the first end face 17a and the first end face 19a of the semiconductor mesa may range, for example, 10 to 100 micrometers. The edge 15c of the reflective layer 15 may be separated from either the first end face 17a or the second end face 17b.

The quantum cascade semiconductor laser 11c includes an insulating film 39, which covers the edge 15c of the reflective layer 15 and the surface of the reflective layer 15. In the present embodiment, the insulating film 39 is in contact with the first and second end faces 17a and 17b. The insulating film 39 covering the reflective layer 15 increases the mechanical strength of the reflective layer 15, so that the reflective layer 15 is less likely to be damaged in the chip forming step.

Several embodiments have been described above. In these embodiments, the same reflective layer 15 is disposed on each of the first and second end faces 19a and 19b of the semiconductor mesa 19c. The material and/or the number of films of the reflective layer 15 may be different between the first mesa end face 19a and the second mesa end face 19b.

Instead of the buried heterostructure shown in FIGS. 3 and 7, the quantum cascade semiconductor laser according to the present embodiments may have another structure including an insulating layer, which works as a current blocking layer, in contact with the first and second side faces 19f and 19g of the semiconductor mesa 19c. This insulating layer can be a dielectric film, such as $SiO_2$, SiON, and SiN.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A quantum cascade semiconductor laser comprising:
 a substrate having a principal surface;
 a semiconductor mesa disposed on the principal surface of the substrate, the semiconductor mesa having a core layer extending in a direction of a first axis, and an end face extending in a direction of a second axis intersecting the direction of the first axis; and
 a reflective layer disposed on the end face of the semiconductor mesa, the reflective layer including a first semiconductor film in contact with the core layer,
 wherein the core layer has a superlattice structure that includes a quantum well layer and a barrier layer, and
 the first semiconductor film of the reflective layer has a bandgap equal to or smaller than that of the quantum well layer.

2. The quantum cascade semiconductor laser according to claim 1, wherein the first semiconductor film is made of substantially the same material as that of the quantum well layer in constituent elements and composition of the quantum well layer.

3. The quantum cascade semiconductor laser according to claim 1, wherein the first semiconductor film includes at least one of undoped semiconductor or semi-insulating semiconductor.

4. The quantum cascade semiconductor laser according to claim 1, wherein the first semiconductor film includes at least one of GaInAs or GaInAsP.

5. The quantum cascade semiconductor laser according to claim 1, wherein
 the reflective layer includes a second semiconductor film of material having a higher thermal conductivity than that of the first semiconductor film; and
 the first semiconductor film is disposed between the second semiconductor film and the end face of the semiconductor mesa.

6. The quantum cascade semiconductor laser according to claim 5, wherein the second semiconductor film of the reflective layer includes at least one of undoped semiconductor or semi-insulating semiconductor.

7. The quantum cascade semiconductor laser according to claim 5, wherein
the second semiconductor film of the reflective layer includes InP, and
the second semiconductor film is in contact with the first semiconductor film to form a junction.

8. The quantum cascade semiconductor laser according to claim 1, further comprising an embedding region embedding a side face of the semiconductor mesa, wherein
the embedding region includes a first current blocking layer,
the semiconductor mesa and the embedding region constitute a waveguide mesa, and
the first current blocking layer is made of substantially the same material as that of the first semiconductor film in constituent elements and composition of the first semiconductor film.

9. The quantum cascade semiconductor laser according to claim 8, wherein the first current blocking layer and the first semiconductor film constitute a single semiconductor layer.

10. The quantum cascade semiconductor laser according to claim 8, wherein
the embedding region further includes a second current blocking layer,
the first current blocking layer is disposed between the second current blocking layer and the side face of the semiconductor mesa, and
the second current blocking layer is made of substantially the same material as that of the second semiconductor film in constituent elements and composition of the second semiconductor film.

11. The quantum cascade semiconductor laser according to claim 10, wherein the second current blocking layer and the second semiconductor film constitute a single semiconductor layer.

12. The quantum cascade semiconductor laser according to claim 1, further comprising an insulating layer disposed on the reflective layer.

13. The quantum cascade semiconductor laser according to claim 1,
wherein the substrate includes a first end face and a second end face arranged in the direction of the first axis,
the principal surface has a first area and a second area arranged in the direction of the first axis,
the semiconductor mesa and the reflective layer are disposed on the first area and the second area, respectively,
the second area reaches an upper edge of the first end face of the substrate,
the first semiconductor film includes a first portion disposed on the end face, and a second portion disposed on the second area, and
the second portion has an edge apart from the upper edge of the first end face.

* * * * *